United States Patent [19]

Helda, deceased et al.

[11] 4,394,352
[45] Jul. 19, 1983

[54] MELT RECHARGE APPARATUS

[75] Inventors: Robert W. Helda, deceased, late of Scottsdale, Ariz.; by Cynthia Hazeltine, executor, Phoenix; H. Ming Liaw, Scottsdale, both of Ariz.

[73] Assignee: Motorola, Inc., Schaumburg, Ill.

[21] Appl. No.: 130,913

[22] Filed: Mar. 17, 1980

[51] Int. Cl.³ ............................................. C30B 15/02
[52] U.S. Cl. .................................. 422/232; 422/249; 414/180; 220/19
[58] Field of Search ......................... 422/232, 253, 249; 156/DIG. 73, 617 SP; 13/33, 34; 75/65 R; 414/160, 180; 432/239, 242; 266/901, 905, 94, 95, 206; 220/19

[56] References Cited

U.S. PATENT DOCUMENTS 2,912,133 11/1959 Adrian ..................................... 220/19
2,975,036 3/1961 Taylor et al. ......................... 422/249
4,036,595 7/1977 Lorenzini et al. ............. 156/617 SP

OTHER PUBLICATIONS

Condensed Chemical Dictionary–8th Ed., Hawley Van Nostrand Reinhold, N.Y., 1971, p. 846.

Primary Examiner—Hiram H. Bernstein
Attorney, Agent, or Firm—John A. Fisher

[57] ABSTRACT

A self-actuated charge container is open at one end except for deformable support members which are positioned to support the charge material. The support members are formed of a material which has sufficient rigidity at room temperature to support the charge material but which when heated above its annealing temperature loses its rigidity and can no longer support the charge material which therefore falls into the existing melt. Upon cooling, the support members regain their rigidity and can be reformed for reuse.

3 Claims, 2 Drawing Figures

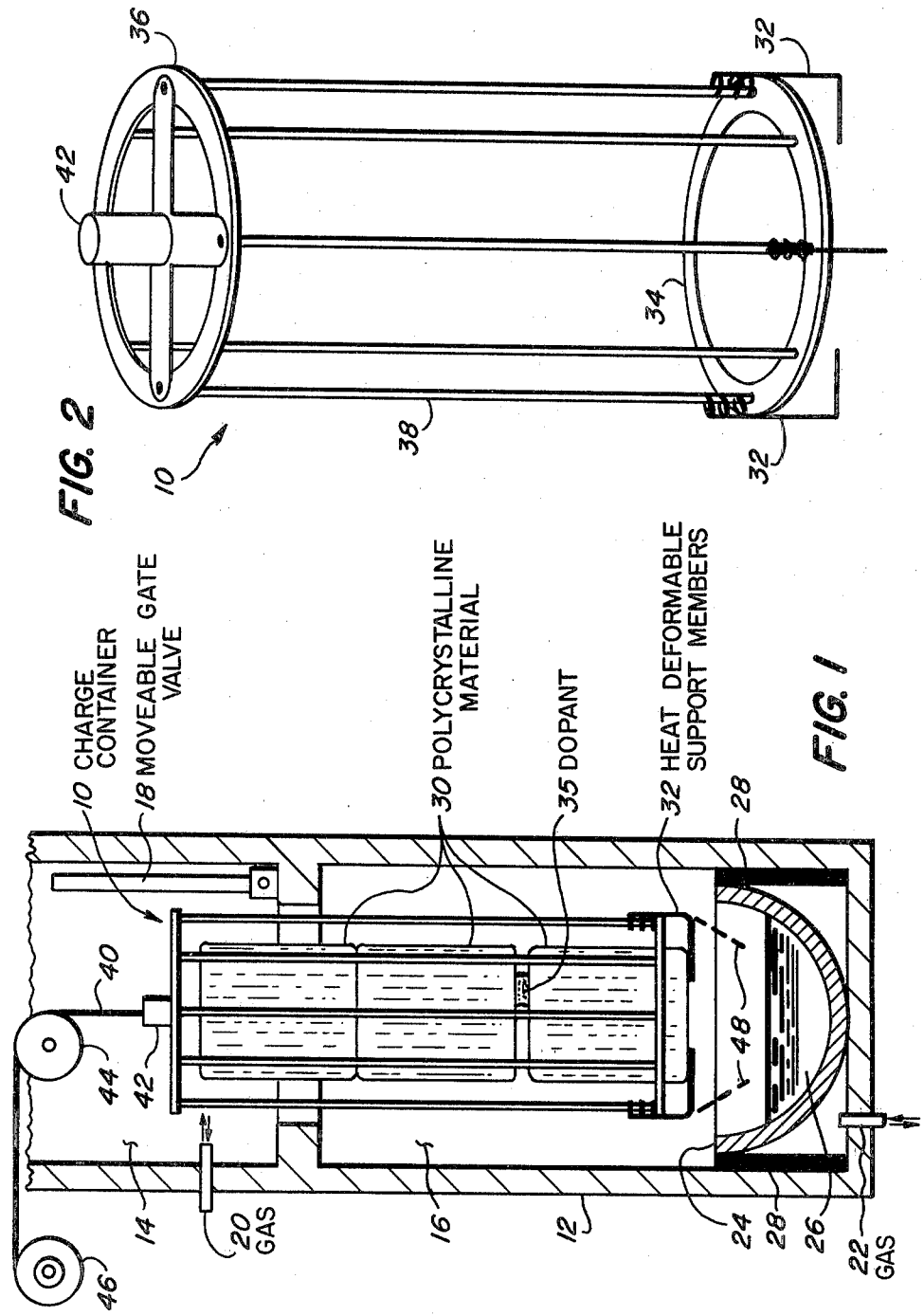

MELT RECHARGE APPARATUS

BACKGROUND OF THE INVENTION

This invention relates in general to a method and apparatus for charging a furnace, and more particularly to a method and apparatus for the self-activated recharging of a furnace melt.

Many types of crystalline ingots are pulled from a melt by a process such as the Czochralski method. This is the case, for example, for most of the silicon crystals used in the semiconductor industry. Typically, in the Czochralski method, a crucible is charged with raw material such as pure polycrystalline silicon. The charge is melted in a furnace under carefully controlled atmospheric conditions which can include inert ambients to prevent oxidation. A crystal is pulled from the melt by well-known techniques which include dipping an oriented seed crystal into the melt and controllably withdrawing the seed to nucleate growth of a high quality single crystalline ingot. After growth of an ingot some melt usually remains in the crucible. To grow an additional ingot the furnace and crucible must be cooled to room temperature, the old melt removed, and the crucible recharged. This must be done at room temperature or at least at a reduced temperature because the melt cannot be exposed to an oxidizing and contaminating room ambient while at a high temperature. Cycling between high and low temperatures often results in destruction of the crucible, especially when the severe temperature cycling is accompanied by a large mismatch in thermal coefficient of expansion between the crucible and the remaining melt. The temperature cycling inevitably results in a costly loss of time and energy.

To prevent the destruction of crucibles, to more fully utilize furnace equipment, and to be more energy conservative, it is therefore desirable to have an ingot-pulling process which does not require cooling between cycles. An apparatus for carrying out such a process was disclosed in U.S. Pat. No. 2,975,036. The apparatus includes a doublechamber structure, with one chamber for growing the ingot, the other for facilitating ambient control during loading and unloading. The ambient can be separately controlled in each chamber; the two chambers are separated by a movable isolation gate valve.

One problem with such an apparatus, however, relates to recharging the melt. Recharge material can be easily loaded into the loading chamber of the apparatus, the chamber can be purged and filled with the desired ambient, but the charge material cannot simply be dropped into the crucible as this would cause severe problems with splashing of extremely high temperature material. The aforementioned U.S. Pat. No. 2,975,036 suggests the use of a mechanical clamping apparatus such as tongs, but such mechanical means are susceptible to sticking, locking, or other failure at the high temperatures encountered. The clamping apparatus also has no means for introducing a controlled amount of dopant with the charge material. Alternate recharging methods are illustrated in U.S. Pat. Nos. 3,031,275 and 4,036,595. These methods, however, are not without their problems and limitations including, for example, difficulties associated with handling large pieces of charge material, controlling ambient, conveying high temperature molten material, and adding a precise amount of dopant.

Accordingly, in view of the deficiencies of prior art methods and apparatus, it is an object of this invention to provide a self-release apparatus for charging or recharging a furnace.

It is a further object of this invention to provide a reusable apparatus capable of reliably recharging a melt with large pieces of charge material without excessive melt splashing.

It is a further object of this invention to provide an improved method for charging a furnace without first cooling that furnace.

It is a further object of this invention to provide a method for recharging a furnace with a precise doping concentration.

SUMMARY OF THE INVENTION

The foregoing and other objects and advantages are achieved in the present invention through the use of a unique charge container. The container is employed for confining the charge material and has a lower end which is open except for deformable members which are positioned across the end to support the charge material. The members are sufficiently rigid at low temperature to support the charge but are characterized by an annealing temperature above which the members can soften and deform to allow release of the charge. The container is used in a charging or recharging operation by lowering the filled container into a heated furnace. The heat causes the members to soften and deform under the weight of the charge, transferring the charge from the container to the furnace.

BRIEF DESCRIPTION OF THE DRAWINGS

FIG. 1 illustrates a charge container in accordance with the invention recharging a crystal growing furnace; and FIG. 2 illustrates one embodiment of a charge container in accordance with the invention.

DETAILED DESCRIPTION OF PREFERRED EMBODIMENTS

While described with respect to an apparatus and method used in conjunction with a growing of a single crystal silicon ingot, the invention is not so limited, and is applicable to the charging of furnaces in a wide variety of applications as will be appreciated by those skilled in the art. In FIG. 1, furnace 12 is divided into an upper chamber 14 and a lower chamber 16 by means of a movable gate valve 18. In its closed position, gate valve 18 provides a seal between the upper and lower chambers and permits independent control of the ambient in each chamber. Gas inlets and outlets shown schematically at 20 and 22 allow control of the ambient in the upper and lower chambers, respectively. A crucible 24 is provided in lower chamber 16 to contain melt 26. The melt is heated by heater 28. In particular, for the growth of a silicon crystal, crucible 24 typically comprises quartz, melt 26 is pure silicon to which controlled amounts of dopant additives have been added, and heater 28 preferably comprises a graphite resistant heater.

At the completion of a crystal-pulling cycle a small amount of melt remains in the crucible. This melt must be recharged before a subsequent crystal-pulling cycle can begin. In accordance with the invention, this is accomplished by loading charge container 10 with large chunks 30 of recharge material. For the growth of a silicon crystal, the recharge mateial is pure polycrystalline silicon. Additional dopant 35 for the pure silicon is sandwiched between the chunks 30. The charge is advantageously in the form of large chunks about 9 to 10 centimeters in diameter as it is normally produced. The large chunks minimize surface area which can absorb undesirable impurities such as oxygen. Use of the naturally produced large chunks also eliminates the need for any additional steps of sizing, crushing, or the like. A typical silicon charge consists of 7-9 Kg of silicon. These silicon chunks are supported within container 10 by support members 32. The dopant is in the form of powder, heavily doped wafer or the like.

FIG. 2 shows a preferred embodiment of a charge container 10 in more detail. The particular configuration of the charge container is not essential to the invention. In this embodiment the container is a cage comprising a bottom ring 34, a top ring 36, with a number of rods 38 extending between the rings to roughly define a cylindrical enclosure. The container is fabricated of a metal such as stainless steel or preferably tantalum which will withstand the extreme temperatures encountered within the crystal growing furnace. Tantalum is preferred because, at those temperatures, it is less likely to contaminate or dope the charge material. For chunks of charge material 9-10 cm in diameter, the container can have a cylindrical diameter of about 10-11 cm. A self-release mechanism for releasing the charge into the furnace at the appropriate time is provided by a plurality of support members 32. These members must support the charge material and effectively close the end of the container. The support members are formed of a material which is sufficiently rigid at room temperature to support the weight of the charge. At a determined elevated temperature the support members soften, bend under the force of the charge and release the charge at the appropriate time.

Material for the support members is selected to have sufficient rigidity at low temperatures to support the charge material but to release the material reproducibly at temperatures encountered within the furnace. For silicon, stainless steel (such as piano wire) and tantalum are two materials which can be used for the support members with tantalum being the preferred material. Both materials have the appropriate release qualities, but stainless steel and silicon can form an alloy at relatively low temperatures; tantalum does not have such alloying properties with silicon and has an annealing temperature in the range of 800° C. above which it softens, loses its yield strength and bends under the weight of the charge. The 800° C. temperature is easily achieved by lowering the container into the furnace so that the support members are in proximity to the molten silicon, which is at a temperature greater than about 1400° C. The size and number of support members required is determined by the torque exerted on the members and the material selected for the members. The torque, in turn, is determined by the size of the charge being supported, and the difference between the outer diameter of the charge and the inner diameter of the container. For a 7-9 Kg charge of silicon in the form of large pieces having a diameter about 1 cm less than the inner wall diameter of the container, three tantalum wires having a diameter of about 1.5 mm are adequate. The wires are suitably, although not necessarily regularly, spaced about the circumference of the lower ring.

Returning to FIG. 1, after loading the container with charge material and placing or bending the support members into position, the container is lowered into the upper chamber of the furnace and that chamber is sealed by a cover member (not shown). During this loading operation, isolation gate valve 18 is closed to seal bottom enclosure portion 16 to prevent oxidation or contamination of heated melt 26. Upper chamber 14 is purged and back-filled with an inert gas. After purging the upper chamber, gate valve 18 is opened to allow lowering of the charge container into the lower chamber 16. The container is lowered on seed-pulling cable 40 which is attached to a bracket 42 or other connection to the container. The seed-pulling cable is used later in the process for lowering the seed crystal and for pulling the silicon crystal. Cable 40 is shown schematically passing over a pulley 44 to a drive motor 46. The cable is typically a flexible steel cable and would, by itself, be unable to perform any mechanical operations to activate other release-type mechanisms such as releasing a gripping mechanism. Using the seed-pulling cable for such a double purpose as herein described thus eliminates the necessity for providing additional airtight feedthroughs for additional control cables or mechanisms.

The temperature of melt 26 is adjusted to the melting point of silicon (1420° C.) so that a crust of silicon is formed in equilibrium with the underneath melt. The container is lowered into the lower chamber so that the support members are in close proximity to this melt crust. In approximately 2-5 minutes, the tantalum wires are sufficiently heated by radiation from the melt to anneal the wires and cause them to soften. The load exerted by the charge material forces the softened wires to yield to open the bottom of the container as shown by the dotted lines 48. With the support members bent to the open position 48, the charge material is released into the quartz crucible.

The use of short support members 32 as a self-acting release mechanism allows the positioning of the charge container in close proximity, e.g. about 3-5 cm, to the surface of the existing melt. This close spacing minimizes splashing of the melt when the charge is released and thus minimizes a possibility of damage to the crucible. After the charge has been released into the quartz crucible, container 10 is withdrawn on the seed-pulling cable to the upper chamber 14 and then removed from the furnace so that the normal crystal-pulling operation can be performed. After cooling, the wires regain their original ridigity and can be reformed and used again.

There has thus been provided, in accordance with the invention, a novel charging apparatus and method that fully meets the objects and advantages set forth above. The apparatus employs deformable support members that provide a self-acting release mechanism for charging a heated furnace. While the invention has been described in conjunction with the recharging of a silicon crystal growth furnace, it is not intended that the invention or its use be so limited. The invention can be utilized in the charging or recharging of any heated furnace. Use of the invention in other applications will require the selection of a material for the support members in accordance with that application. The material must soften at temperatures encountered in the particular application, and preferably should be non-contaminating to the charge material.

We claim:

1. An improved recharging apparatus including a container into which charge material can be loaded, wherein the improvement comprises thermally deformable tantalum support means closing an end of said container and capable at room temperature of supporting the weight of said charge material, said means deformable at an elevated temperature to release said charge material.

2. An apparatus for charging a furnace with material which comprises: container means for confining said material, said container having an open end; and deformable means comprising tantalum wire positioned to enclose said open end and to support said material, said material exerting a force on said deformable means, said deformable means characterized by an annealing temperature above which said deformable means are capable of bending under said force to a non-supportive position to release said material.

3. The apparatus of claim 2 wherein said deformable means can be reshaped for repeated usage.

* * * * *